US009437329B2

(12) United States Patent
Park

(10) Patent No.: US 9,437,329 B2
(45) Date of Patent: Sep. 6, 2016

(54) SEMICONDUCTOR DEVICE WITH INITIALIZATION OPERATION AND BOOT-UP OPERATION

(71) Applicant: SK hynix Inc., Gyeonggi-do (KR)

(72) Inventor: Ga-Ram Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/533,861

(22) Filed: Nov. 5, 2014

(65) Prior Publication Data
US 2016/0012873 A1     Jan. 14, 2016

(30) Foreign Application Priority Data
Jul. 9, 2014  (KR) ........................ 10-2014-0086125

(51) Int. Cl.
G11C 29/00       (2006.01)
G11C 7/20        (2006.01)

(52) U.S. Cl.
CPC ................ G11C 29/70 (2013.01); G11C 7/20 (2013.01); *G11C 2229/743* (2013.01); *G11C 2229/763* (2013.01)

(58) Field of Classification Search
CPC ... G11C 29/70; G11C 7/20; G11C 2229/743; G11C 2229/763
USPC ............... 365/230.03, 96; 713/150, 375, 400
See application file for complete search history.

(56) References Cited

U.S. PATENT DOCUMENTS

| 5,054,000 A * | 10/1991 | Miyaji .................. G11C 11/419 365/185.04 |
| 5,655,148 A * | 8/1997 | Richman ............... G06F 9/4411 710/11 |
| 5,751,987 A * | 5/1998 | Mahant-Shetti ...... G06F 9/3879 365/230.04 |
| 6,473,857 B1 * | 10/2002 | Panas .................... G06F 9/4405 709/222 |
| 6,697,289 B1 | 2/2004 | Yamamoto |
| 8,135,991 B2 * | 3/2012 | Katano ............... G06F 11/1417 714/36 |
| 8,514,643 B2 * | 8/2013 | Wienchol ................ G11C 11/46 365/189.02 |
| 2003/0120911 A1 * | 6/2003 | Muench-Casanova ... G06F 8/60 713/2 |
| 2005/0160069 A1 * | 7/2005 | Park ...................... G06F 3/0625 |
| 2006/0129848 A1 * | 6/2006 | Paksoy .................. G06F 21/78 713/193 |
| 2011/0016301 A1 * | 1/2011 | Galicia ................... G06F 9/461 713/2 |
| 2013/0279689 A1 * | 10/2013 | Obaidi ...................... H04L 9/28 380/28 |
| 2014/0200860 A1 * | 7/2014 | Jun ....................... G06F 9/4418 703/1 |
| 2014/0237223 A1 * | 8/2014 | Chudgar ............... G06F 9/4408 713/2 |

* cited by examiner

Primary Examiner — Alexander Sofocleous
Assistant Examiner — Sung Cho
(74) Attorney, Agent, or Firm — IP & T Group LLP

(57) ABSTRACT

A semiconductor device includes: a first block, which is initialized during an initialization mode; and a second block, which is initialized while the first block latches first signals during a boot-up mode. Herein, the second block may latch second signals after being initialized during the boot-up mode.

13 Claims, 8 Drawing Sheets

SEMICONDUCTOR DEVICE WITH INITIALIZATION OPERATION AND BOOT-UP OPERATION

CROSS-REFERENCE TO RELATED APPLICATIONS

The present application claims priority of Korean Patent Application No. 10-2014-0086125, filed on Jul. 9, 2014, which is incorporated herein by reference in its entirety.

BACKGROUND

1. Field

Exemplary embodiments of the present invention relate to a semiconductor design technology, and more particularly, to a semiconductor device requiring an initialization operation.

2. Description of the Related Art

A semiconductor device generally includes a fuse circuit to store various pieces of information for setting its operation environment. For example, fuse circuits store redundancy information according to defects, trimming information of internal voltages, Mode Register Set (MRS) information, and so on.

Fuse circuits are divided into physical fuse circuits, whose connection states are controlled by laser radiation, and electrical fuse circuits, whose connection states are controlled by electrical signals.

Recently, electrical fuse circuits, which may be programmed after the package stage, are widely used instead of physical fuse circuits, which are only programmable before the package stage.

During a boot-up mode, the fuse circuit outputs fuse signals, which represent whether fuses are connected and are stored in a predetermined latch circuit. The latch circuit needs an initialization operation during an initialization mode for stable operation of the semiconductor device.

FIG. 1 is a block diagram illustrating a semiconductor device according to a prior art.

Referring to FIG. 1, a semiconductor device 100 includes first to eighth banks 110A to 110H for storing and providing data, first to eighth latch blocks 120A to 120H corresponding to the first to eighth banks 110A to 110H, and a fuse block 130 for outputting first to eighth fuse signals FZDATA0<0:n> to FZDATA7<0:n>, respectively, to the first to eighth latch blocks 120A to 120H during a boot-up mode.

The first to eighth banks 110A to 110H store data inputted from an external device during a write mode, and provide the external device with the stored data during a read mode.

The first to eighth latch blocks 120A to 120H are initialized in response to an initialization signal FZLATRSTB enabled during a predetermined section of an initialization mode, and latch the first to eighth fuse signals FZDATA0<0:n> to FZDATA7<0:n> outputted from the fuse block 130 during the boot-up mode.

The fuse block 130 groups and sequentially outputs the first to eighth fuse signals FZDATA0<0:n> to FZDATA7<0:n> in response to a boot-up mode signal FZYEN enabled during the boot-up mode, and first to fourth bank selection signals FZ_XBK<0:3> sequentially enabled during the boot-up mode. For example, the fuse block 130 groups and simultaneously outputs a pair of the first and fifth fuse signals FZDATA0<0:n> and FZDATA4<0:n>, a pair of the second and sixth fuse signals FZDATA1<0:n> and FZDATA5<0:n>, a pair of the third and seventh fuse signals FZDATA2<0:n> and FZDATA6<0:n>, and a pair of the fourth and eighth fuse signals FZDATA3<0:n> and FZDATA7<0:n> during the boot-up mode.

FIG. 2 is a circuit diagram illustrating the first latch block 120A shown in FIG. 1.

Referring to FIG. 2, the first latch block 120A includes a plurality of latch portions 120A_1 to 120A_n, which are simultaneously initialized in response to the initialization signal FZLATRSTB during the initialization mode and latch the first fuse signals FZDATA0<0:n> during the boot-up mode.

Each of the latch portions 120A_1 to 120A_n includes an initialization unit, a load unit, a latch unit, and an output unit.

The initialization unit initializes a logic level of a first latch node to a logic high level in response to the initialization signal FZLATRSTB.

The load unit transitions the logic high level of the first latch node to a logic low level in response to a first fuse signal FZDATA0<#>.

The latch unit inverts the logic level of the first latch node, and outputs the inverted logic level of the first latch node to a second latch node, and then latches the logic levels of the first and second latch nodes.

The output unit outputs the logic level of the second latch node as a first fuse output signal FZOUT0<#>.

For example, the initialization unit includes a PMOS transistor, to a gate of which the initialization signal FZLATRSTB is inputted, and which is coupled with a high voltage, e.g., a power source voltage VDD, and the first latch node at its source and drain.

The load unit includes an NMOS transistor, to a gate of which the first fuse signal FZDATA0<#> is inputted, and which is coupled with a low voltage, e.g., a ground voltage VSS, and the first latch node at its source and drain.

The latch unit includes a first inverter, input and output nodes which are respectively the first and second latch nodes, and a second inverter, input and output nodes which are respectively the second and first latch nodes.

The output unit includes first and second inverters serially coupled with each other.

The second to eighth latch blocks 120B to 120H have the same structure as the first latch block 120A. However, the second latch block 120B receives the second fuse signals FZDATA1<0:n> instead of the first fuse signals FZDATA0<0:n>, and the third latch block 120C receives the third fuse signals FZDATA2<0:n> instead of the first fuse signals FZDATA0<0:n>, and the fourth lath block 120D receives the fourth fuse signals FZDATA3<0:n> instead of the first fuse signals FZDATA0<0:n>, and the fifth latch block 120E receives the fifth fuse signals FZDATA4<0:n> instead of the first fuse signals FZDATA0<0:n>, and the sixth latch block 120F receives the sixth fuse signals FZDATA5<0:n> instead of the first fuse signals FZDATA0<0:n>, and the seventh latch block 120G receives the seventh fuse signals FZDATA6<0:n> instead of the first fuse signals FZDATA0<0:n>, and the eighth latch block 120H receives the eighth fuse signals FZDATA7<0:n> instead of the first fuse signals FZDATA0<0:n>.

An operation of the semiconductor device 100 is described hereafter.

When the semiconductor device 100 enters the initialization mode, the first to eighth latch blocks 120A to 120H are simultaneously initialized in response to the initialization signal FZLATRSTB, which is enabled during a predetermined section.

Under the condition, when the semiconductor device 100 enters the boot-up mode, the fuse block 130 groups and sequentially outputs the first to eighth fuse signals FZDATA0<0:n> to FZDATA7<0:n> in response to the first to fourth bank selection signals FZ_XBK<0:3>. For example, the fuse block 130 groups and simultaneously outputs a pair of the first and fifth fuse signals FZDATA0<0:n> and FZDATA4<0:n>, and then a pair of the second and sixth fuse signals FZDATA1<0:n> and FZDATA5<0:n>, and subsequently a pair of the third and seventh fuse signals FZDATA2<0:n> and FZDATA6<0:n>, and lastly a pair of the fourth and eighth fuse signals FZDATA3<0:n> and FZDATA7<0:n> during the boot-up mode.

The first to eighth latch blocks 120A to 120H latch the first to eighth fuse signals FZDATA0<0:n> to FZDATA7<0:n>, which are grouped and sequentially inputted.

However, the semiconductor device 100 according to the prior art has the following problems.

The first to eighth latch blocks 120A to 120H include latch portions for each of the first to eighth fuse signals FZDATA0<0:n> to FZDATA7<0:n>. As the first to eighth latch blocks 120A to 120H including the numerous latch portions are simultaneously initialized, an over-current occurs in the semiconductor device 100. The over-current causes the first to eighth latch blocks 120A to 120H to abnormally perform an initialization operation, and furthermore, inevitably causes malfunction of other circuits operating in the initialization mode as well.

SUMMARY

Exemplary embodiments of the present invention are directed to a semiconductor device that initializes latch blocks at different timings.

In accordance with an embodiment of the present invention, a semiconductor device includes: a first block, which is initialized during an initialization mode; and a second block, which is initialized while the first block latches first signals during a boot-up mode.

The second block may latch second signals after being initialized during the boot-up mode.

The semiconductor device may further include a third block, which is initialized while the second block latches the second signals during the boot-up mode, wherein the third block latches third signals after being initialized during the boot-up mode.

The first to third signals may include fuse signals.

In accordance with another embodiment of the present invention, a semiconductor device includes: first and second memory regions; a first block, which is formed corresponding to the first memory region, and which is initialized in response to an initialization signal during an initialization mode; and a second block, which is formed corresponding to the second memory region, and which is initialized in response to a boot-up mode signal and a first region selection signal for selecting the first memory region during a boot-up mode.

The semiconductor device may further include a fuse block suitable for transmitting first fuse signals to the first block in response to the first region selection signal, and transmitting second fuse signals to the second block in response to a second region selection signal for selecting the second memory region.

The first and second region selection signals may be sequentially enabled.

The semiconductor device may further include: third to $n^{th}$ memory regions; and third to $n^{th}$ blocks, which are formed respectively corresponding to the third to $n^{th}$ memory regions, and which are initialized in response to the boot-up mode signal and second to $(n-1)^{th}$ region selection signals for selecting the second to $(n-1)^{th}$ memory regions during the boot-up mode.

The semiconductor device may further include a fuse block suitable for sequentially transmitting first to $n^{th}$ fuse signals to the first to $n^{th}$ blocks for each of the first to $n^{th}$ memory regions in response to the first to $(n-1)^{th}$ region selection signals and a $n^{th}$ region selection signal for selecting the $n^{th}$ memory region during the boot-up mode.

In accordance with another embodiment of the present invention, a method for driving the semiconductor device includes: initializing a first latch block; initializing a second latch block while the first latch block performs a boot-up operation; and performing the boot-up operation of the second latch block.

The first latch block may perform the boot-up operation by latching first fuse signals, and the performing the boot-up operation of the second latch block may latch second fuse signals in the second latch block.

The method may further include sequentially performing the boot-up operation of third to $n^{th}$ latch blocks after the first and second latch blocks perform the boot-up operation, wherein the third to nm latch blocks are sequentially initialized while the second to $(n-1)^{th}$ latch blocks sequentially perform the boot-up operation.

DETAILED DESCRIPTION

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

It is assumed in the disclosure that a fuse program operation is already performed on a fuse block. The fuse program operation is well known to those skilled in the art.

Figure 1:
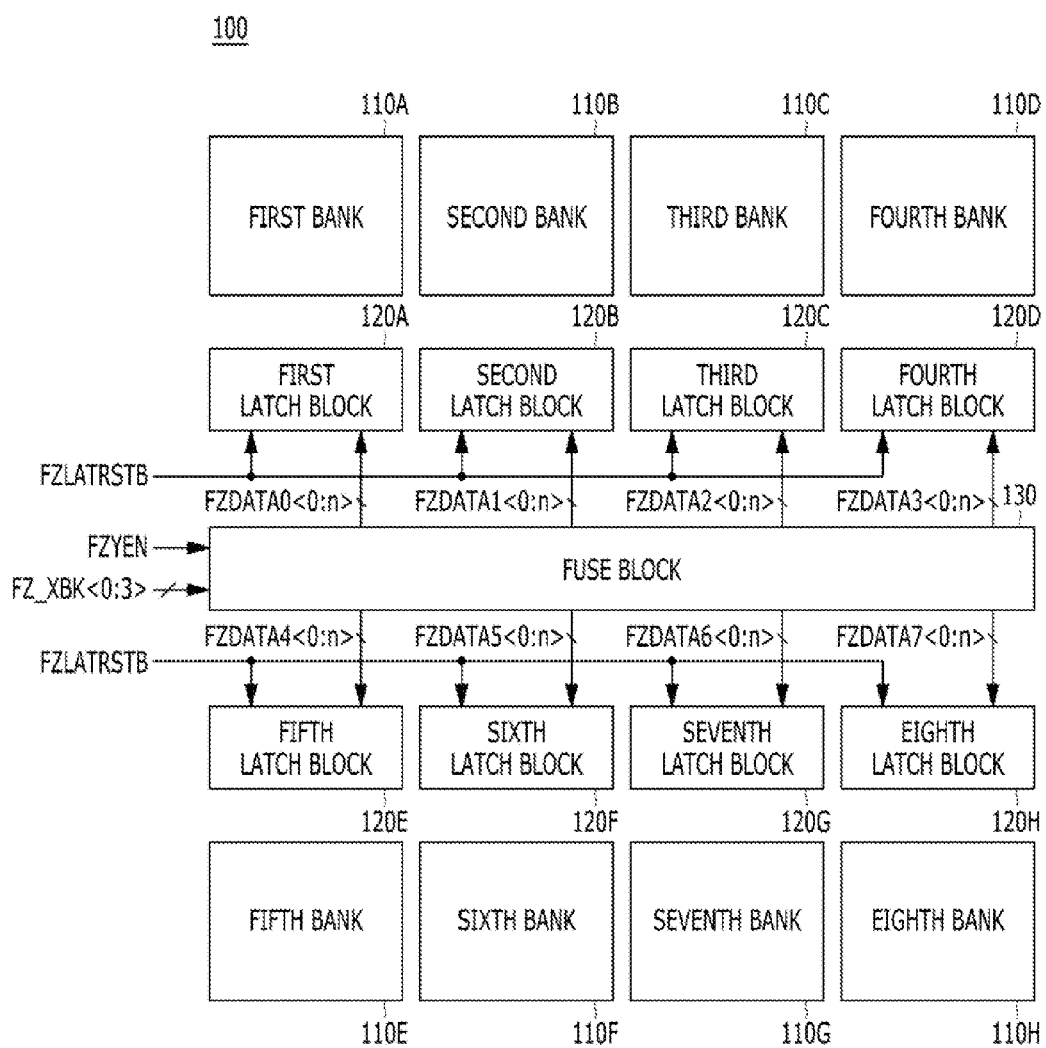
FIG. 1 is a block diagram illustrating a semiconductor device according to a prior art.
Figure 2:
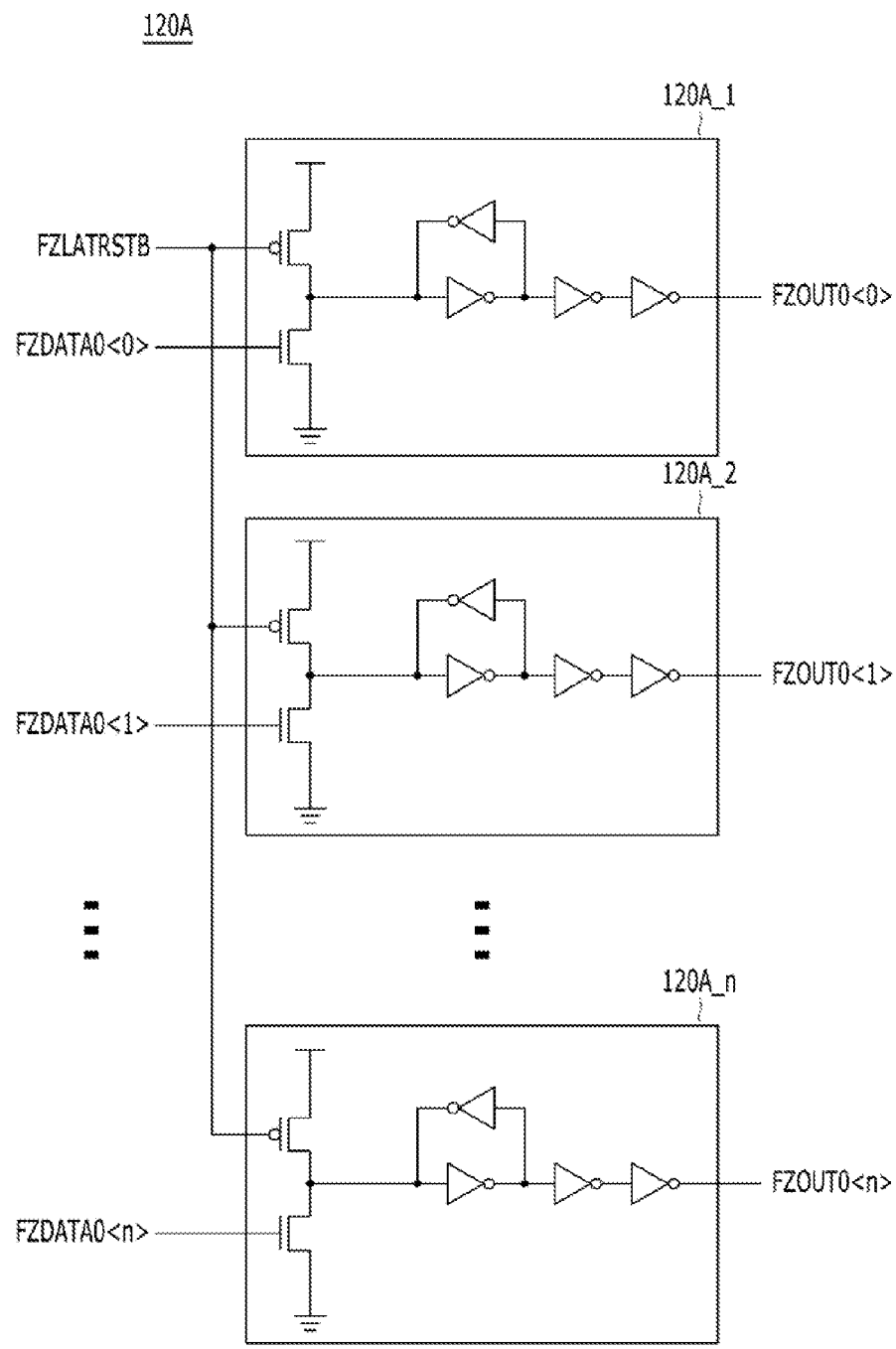
FIG. 2 is a circuit diagram illustrating a first latch block shown in FIG. 1.
Figure 3:
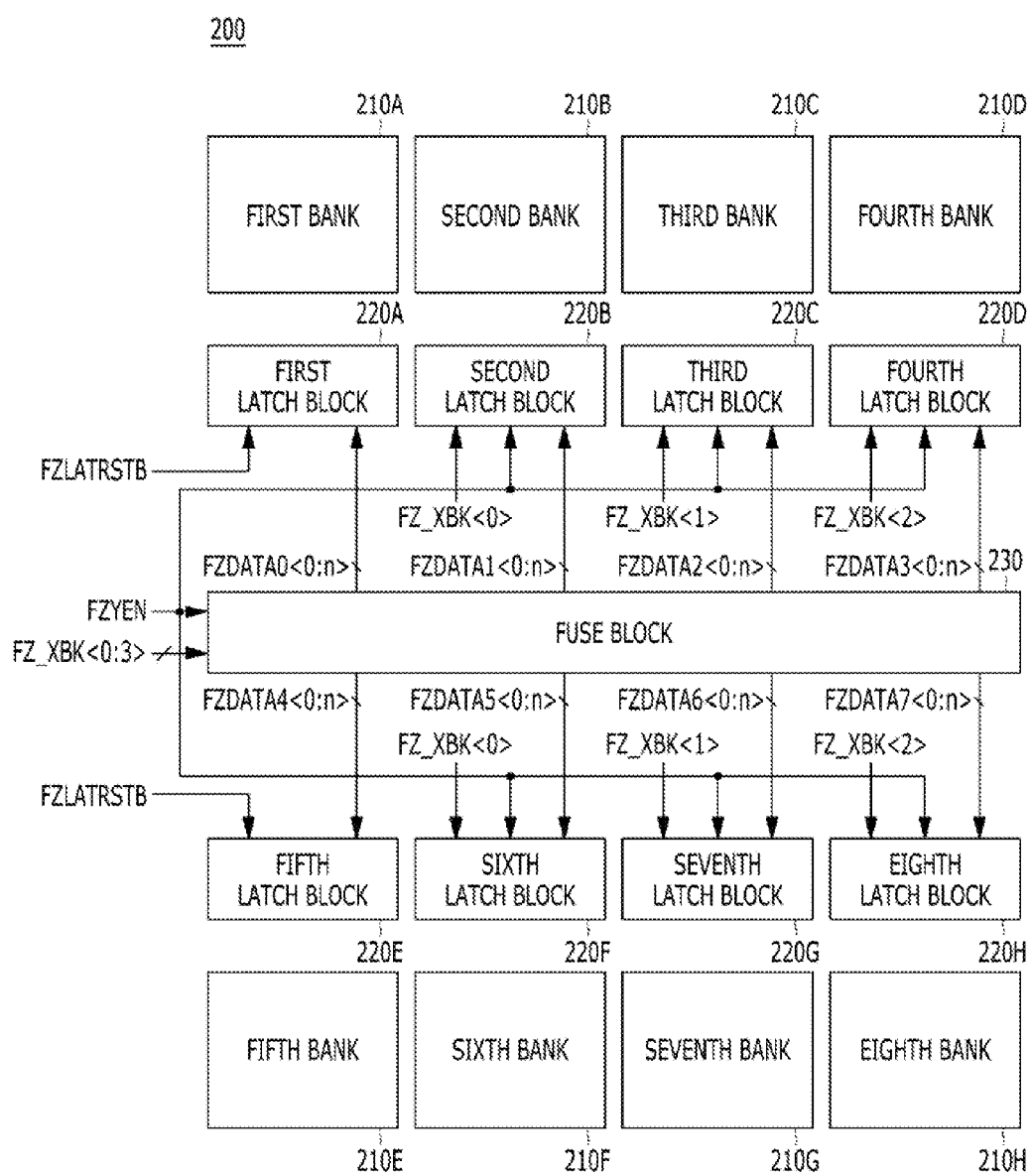
FIG. 3 is a block diagram illustrating a semiconductor device in accordance with an embodiment of the present invention.

FIG. 3 is a block diagram illustrating a semiconductor device in accordance with an embodiment of the present invention.

Referring to FIG. 3, a semiconductor device 200 may include first to eighth banks 210A to 210H for storing and providing data, first to eighth latch blocks 220A to 220H corresponding to the first to eighth banks 210A to 210H, and a fuse block 230 for outputting first to eighth fuse signals FZDATA0<0:n> respectively to FZDATA7<0:n> to the first to eighth latch blocks 220A to 220H during a boot-up mode.

The first to eighth banks 210A to 210H may store data inputted from an external device during a write mode, and provide the external device with the stored data during a read mode. The first to eighth banks 210A to 210H are general memory regions well known to those skilled in the art.

The first to eighth latch blocks 220A to 220H may be grouped by two latch blocks and sequentially initialized. Particularly, a pair of the first and fifth latch blocks 220A and 220E may be initialized during an initialization mode, and the second to fourth latch blocks 220B to 220D and the sixth to eighth latch blocks 220F to 220H may be initialized during the boot-up mode. For example, a pair of the first and fifth latch blocks 220A and 220E may be simultaneously initialized in response to an initialization signal FZLATRSTB enabled during the initialization mode, and, during the boot-up mode, a pair of the second and sixth latch blocks 220B and 220F may be simultaneously initialized in response to a boot-up mode signal FZYEN and a first bank selection signal FZ_XBK<O>, and a pair of the third and seventh latch blocks 220C and 220G may be simultaneously initialized in response to the boot-up mode signal FZYEN and a second bank selection signal FZ_XBK<1>, and a pair of the fourth and eighth latch blocks 220D and 220H may be simultaneously initialized in response to the boot-up mode signal FZYEN and a third bank selection signal FZ_XBK<2>.

The first to eighth latch blocks 220A to 220H may be grouped by two latch blocks and sequentially perform the boot-up operation during the boot-up mode. For example, the first and fifth latch blocks 220A and 220E may latch the first and fifth fuse signals FZDATA0<0:n> and FZDATA4<0:n> in response to the boot-up mode signal FZYEN and the first bank selection signal FZ_XBK<O>, and the second and sixth latch blocks 220B and 220F may latch the second and sixth fuse signals FZDATA1<0:n> and FZDATA5<0:n> in response to the boot-up mode signal FZYEN and the second bank selection signal FZ_XBK<1>, and the third and seventh latch blocks 220C and 220G may latch the third and seventh fuse signals FZDATA2<0:n> and FZDATA6<0:n> in response to the boot-up mode signal FZYEN and the third bank selection signal FZ_XBK<2>, and the fourth and eighth latch blocks 220D and 220H may latch the fourth and eighth fuse signals FZDATA3<0:n> and FZDATA7<0:n> in response to the boot-up mode signal FZYEN and the fourth bank selection signal FZ_XBK<3>.

The fuse block 230 may group and sequentially output the first to eighth fuse signals FZDATA0<0:n> to FZDATA7<0:n> in response to the boot-up mode signal FZYEN enabled during the boot-up mode, and the first to fourth bank selection signals FZ_XBK<0:3> sequentially enabled during the boot-up mode. For example, the fuse block 230 may group and simultaneously output a pair of the first and fifth fuse signals FZDATA0<0:n> and FZDATA4<0:n>, a pair of the second and sixth fuse signals FZDATA1<0:n> and FZDATA5<0:n>, a pair of the third and seventh fuse signals FZDATA2<0:n> and FZDATA6<0:n>, and a pair of the fourth and eighth fuse signals FZDATA3<0:n> and FZDATA7<0:n> during the boot-up mode. The fuse block 230 having the aforementioned structure may include an e-fuse array circuit well known to those skilled in the art.

The first to eighth latch blocks 220A to 220H may be formed in a core region together with the first to eighth banks 210A to 210H, and the fuse block 230 may be formed in a peripheral region.

FIGS. 4 to 7 are circuit diagrams illustrating the first to fourth latch blocks shown in FIG. 3.

Figure 4:
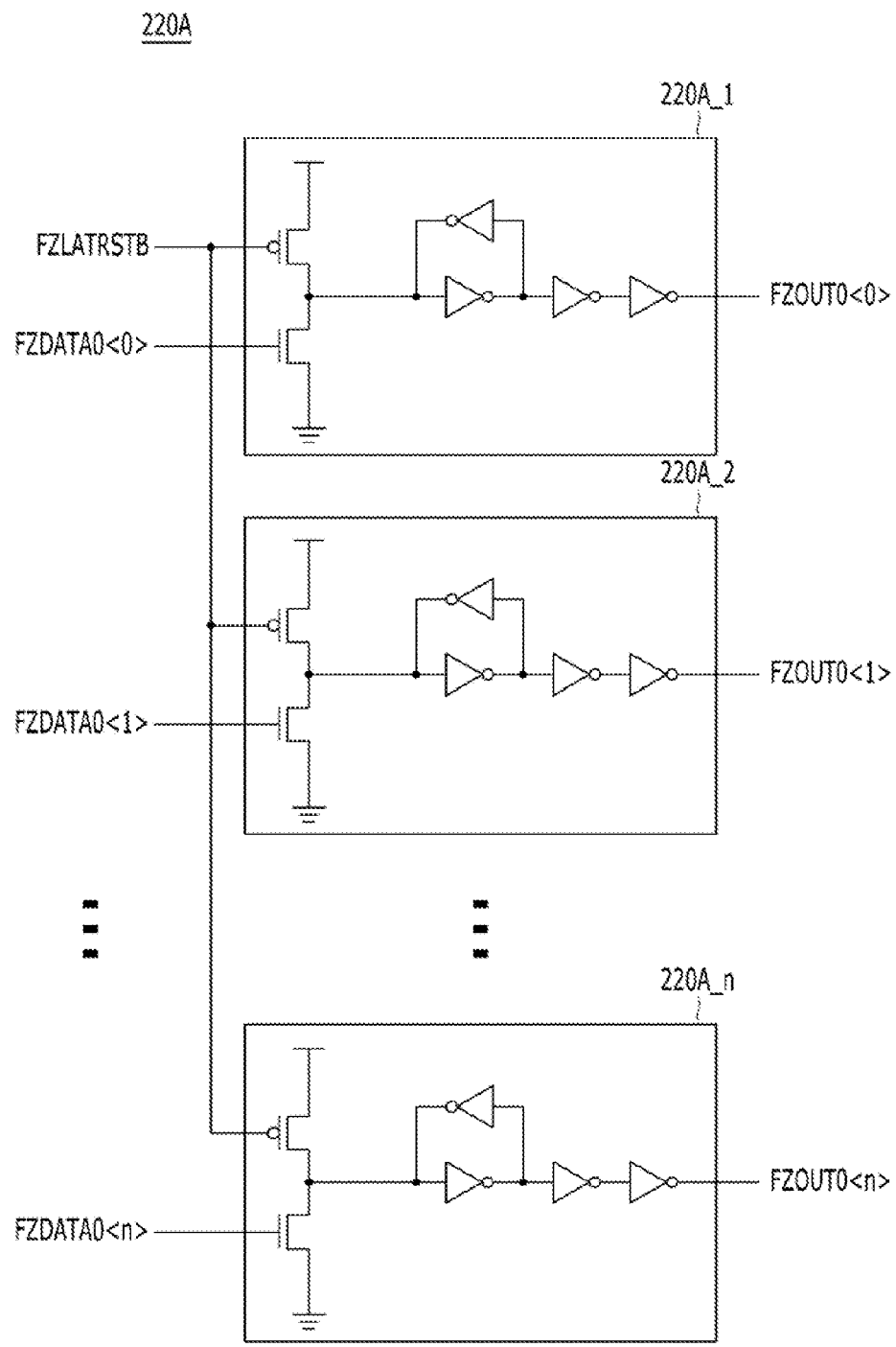
FIG. 4 is a circuit diagram illustrating a first latch block shown in FIG. 3.

Referring to FIG. 4, the first latch block 220A may include a plurality of latch portions 220A_1 to 220A_n, which are simultaneously initialized in response to the initialization signal FZLATRSTB and latch the first fuse signals FZDATA0<0:n> during the boot-up mode.

Each of the latch portions 220A_1 to 220A_n may include an initialization unit, a load unit, a latch unit, and an output unit.

The initialization unit may initialize a logic level of a first latch node to a logic high level in response to the initialization signal FZLATRSTB.

The load unit may transition the logic high level of the first latch node to a logic low level in response to a first fuse signal FZDATA0<#>.

The latch unit may invert the logic level of the first latch node, and may output the inverted logic level of the first latch node to a second latch node, and then latch the logic levels of the first and second latch nodes.

The output unit may output the logic level of the second latch node as a first fuse output signal FZOUT0<#>.

For example, the initialization unit may include a PMOS transistor, to a gate of which the initialization signal FZLATRSTB is inputted, and which is coupled with a high voltage, e.g., a power source voltage VDD, and the first latch node at its source and drain.

The load unit may include an NMOS transistor having a gate to which the first fuse signal FZDATA0<#> is inputted, and which is coupled with a low voltage, e.g., a ground voltage VSS, and the first latch node at its source and drain.

The latch unit may include a first inverter, input and output nodes that are the first and second latch nodes, respectively, and a second inverter, input and output nodes of which are respectively the second and first latch nodes.

The output unit may include first and second inverters serially coupled with each other.

Figure 5:
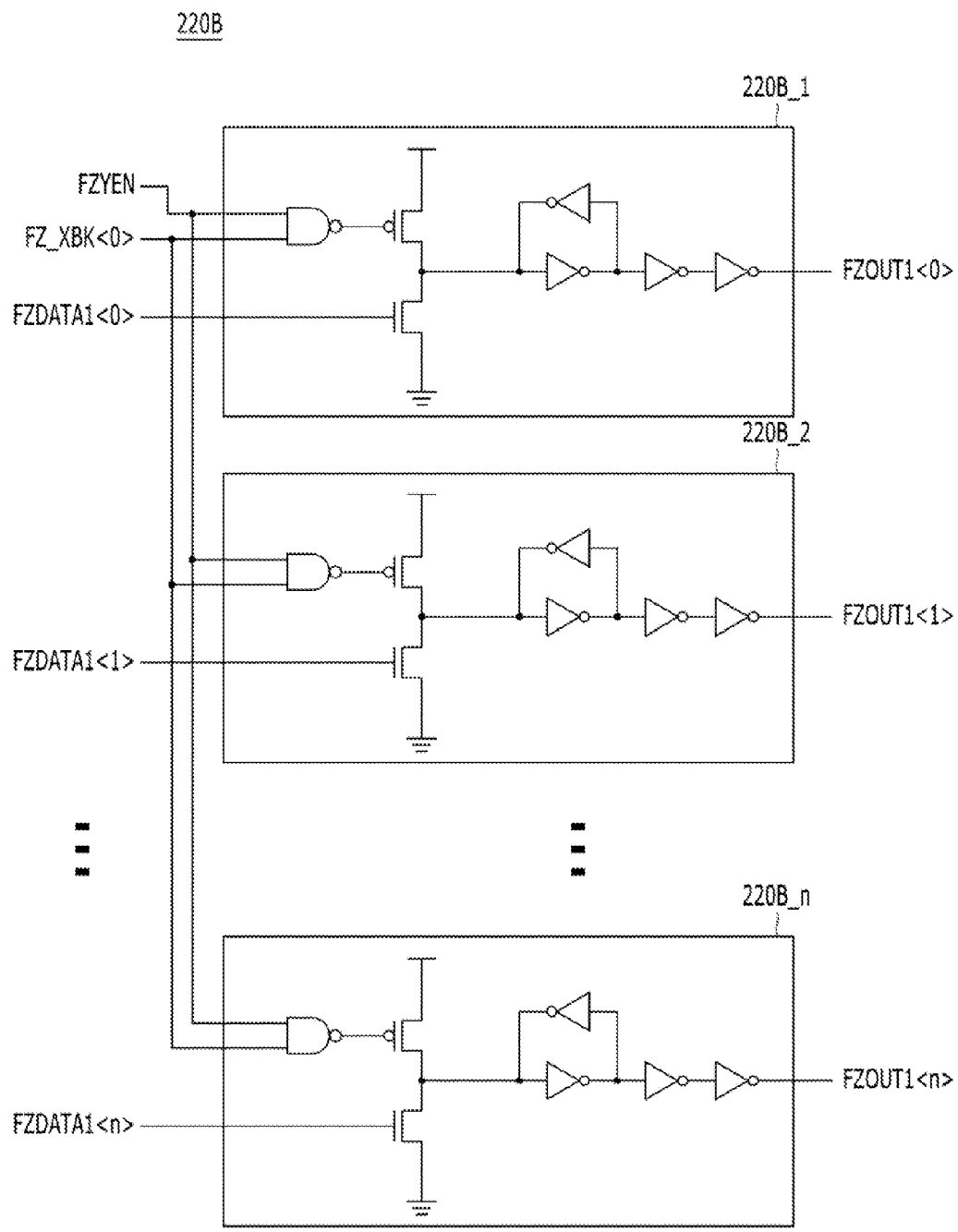
FIG. 5 is a circuit diagram illustrating a second latch block shown in FIG. 3.

Referring to FIG. 5, the second latch block 220B may include a plurality of latch portions 220B_1 to 220B_n, which are simultaneously initialized in response to the boot-up mode signal FZYEN and the first bank selection signal FZ_XBK<O>, and may latch the second fuse signals FZDATA1<0:n> during the boot-up mode.

Each of the latch portions 220B_1 to 220B_n may include an initialization unit, a load unit, a latch unit, and an output unit.

The initialization unit may initialize a logic level of a first latch node to a logic high level in response to the boot-up mode signal FZYEN and the first bank selection signal FZ_XBK<O>.

The load unit may transition the logic high level of the first latch node to a logic low level in response to a second fuse signal FZDATA1<#>.

The latch unit may invert the logic level of the first latch node, and may output the inverted logic level of the first latch node to a second latch node, and then latch the logic levels of the first and second latch nodes.

The output unit may output the logic level of the second latch node as a second fuse output signal FZOUT1<#>.

For example, the initialization unit may include an NAND gate for performing an NAND operation on the boot-up mode signal FZYEN and the first bank selection signal FZ_XBK<O>, and a PMOS transistor that has a gate to which an output signal of the NAND gate is inputted, and which is coupled with a high voltage, e.g., a power source voltage VDD, and the first latch node at its source and drain.

The load unit may include an NMOS transistor having a gate to which the second fuse signal FZDATA1<#> is inputted, and which is coupled with a low-voltage, e.g., a ground voltage VSS, and the first latch node at its source and drain.

The latch unit may include a first inverter, input and output nodes of which are respectively the first and second latch nodes, and a second inverter, input and output nodes of which are respectively the second and first latch nodes.

The output unit may include first and second inverters serially coupled with each other.

Figure 6:
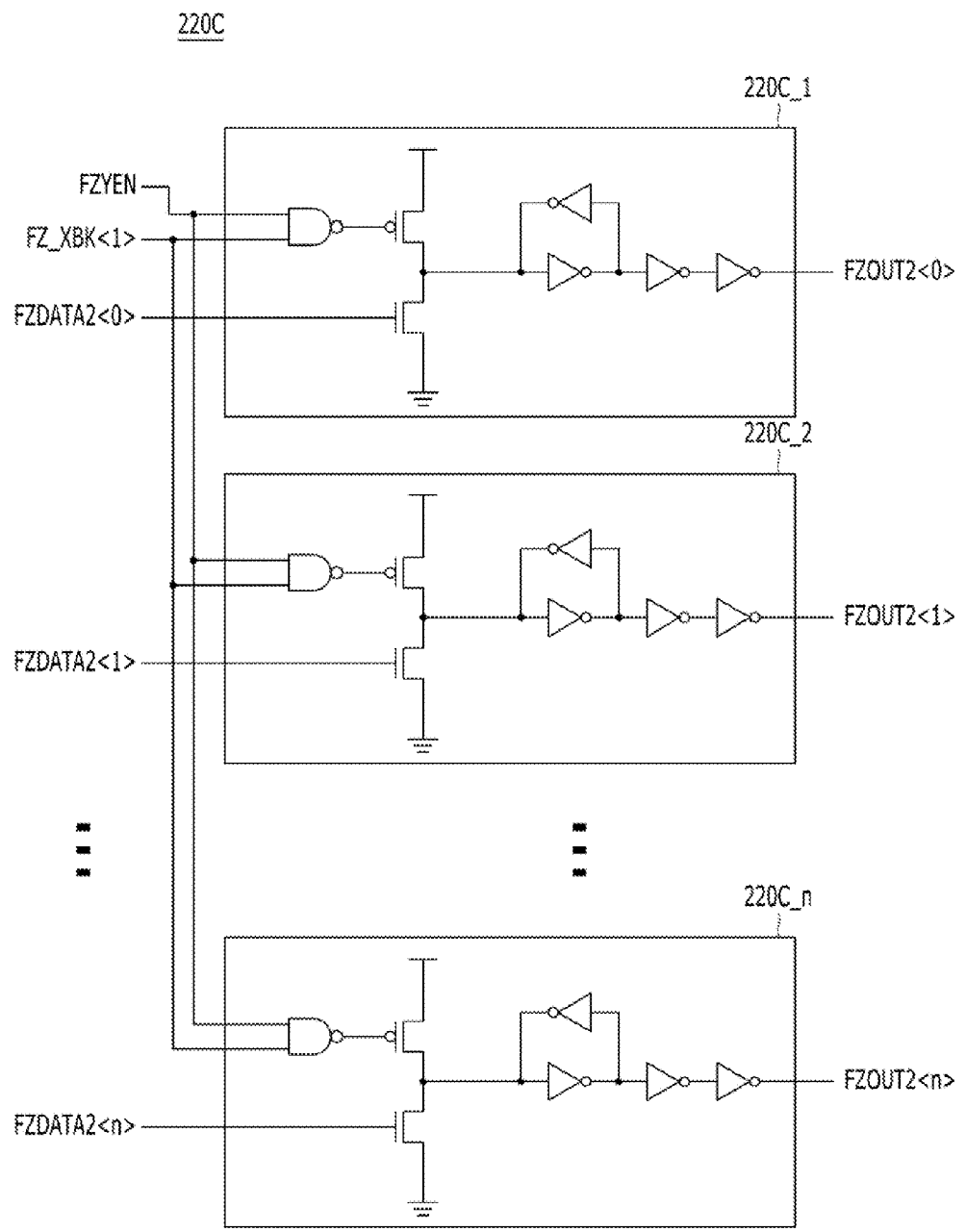
FIG. 6 is a circuit diagram illustrating a third latch block shown in FIG. 3.

Referring to FIG. 6, the third latch block 220C may include a plurality of latch portions 220C_1 to 220C_n, which are simultaneously initialized in response to the boot-up mode signal FZYEN and the second bank selection signal FZ_XBK<1>, and may latch the third fuse signals FZDATA2<0:n> during the boot-up mode.

The latch portions 220C_1 to 220C_n may have the same structure as the latch portions 220B_1 to 220B_n of the second latch block 220B. However, the latch portions 220C_1 to 220C_n included in the third latch block 220C may receive the second bank selection signal FZ_XBK<1> and the third fuse signals FZDATA2<0:n> instead of the first bank selection signal FZ_XBK<0> and the second fuse signals FZDATA1<0: n>.

Figure 7:
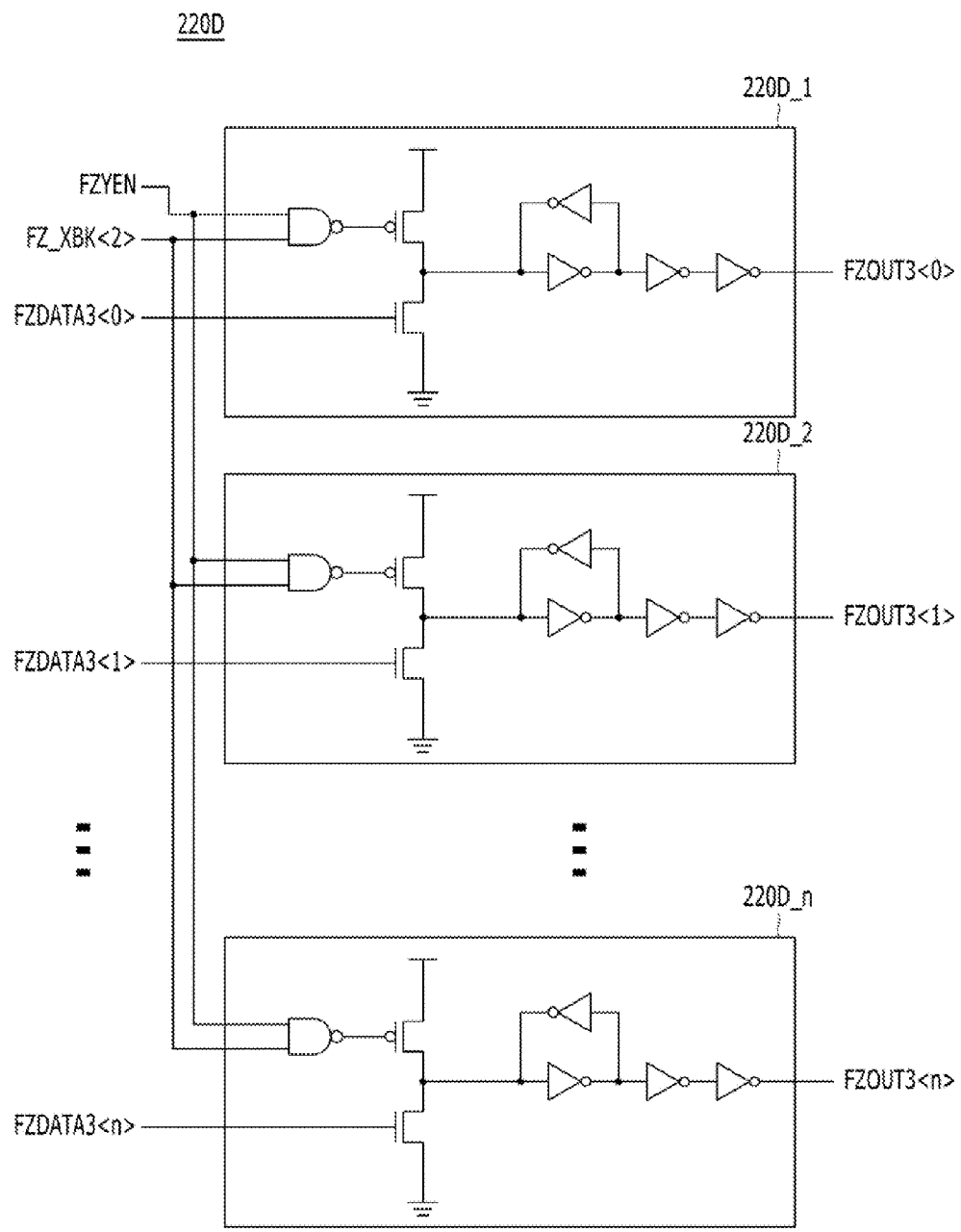
FIG. 7 is a circuit diagram illustrating a fourth latch block shown in FIG. 3.

Referring to FIG. 7, the fourth latch block 220D may include a plurality of latch portions 220D_1 to 220D_n, which are simultaneously initialized in response to the boot-up mode signal FZYEN and the third bank selection signal FZ_XBK<2>, and may latch the fourth fuse signals FZDATA3<0:n> during the boot-up mode.

The latch portions 220D_1 to 220D_n may have the same structure as the latch portions 220B_1 to 220B_n of the second latch block 220S. However, the latch portions 220D_1 to 220D_n included in the fourth latch block 220D may receive the third bank selection signal FZ_XBK<2> and the fourth fuse signals FZDATA3<0:n> instead of the first bank selection signal FZ_XBK<0> and the second fuse signals FZDATA1<0:n>.

The fifth to eighth latch blocks 220E to 220H may have the same structures as the first to fourth latch blocks 220A to 220D, respectively. However, the fifth latch block 220E may receive the fifth fuse signals FZDATA4<0:n> instead of the first fuse signals FZDATA0<0:n>, and the sixth latch block 220F may receive the sixth fuse signals FZDATA5<0: n> instead of the second fuse signals FZDATA1<0:n>, and the seventh latch block 220G may receive the seventh fuse signals FZDATA6<0:n> instead of the third fuse signals FZDATA2<0:n>, and the eighth latch block 220H may receive the eighth fuse signals FZDATA7<0:n> instead of the fourth fuse signals FZDATA3<0:n>.

A method for driving the semiconductor device 200 in accordance with an embodiment of the present invention is described hereafter.

The method for driving the semiconductor device 200 may include simultaneously initializing the first and fifth latch blocks 220A and 220E during the initialization mode, simultaneously initializing the second and sixth latch blocks 220B and 220F while the first and fifth latch blocks 220A and 220E simultaneously perform the boot-up operation during the boot-up mode, simultaneously initializing the third and seventh latch blocks 220C and 220G while the second and sixth latch blocks 220B and 220F simultaneously perform the boot-up operation during the boot-up mode, simultaneously initializing the fourth and eighth latch blocks 220D and 220H while the third and seventh latch blocks 220C and 220G simultaneously perform the boot-up operation during the boot-up mode, and simultaneously performing the boot-up operation of the fourth and eighth latch blocks 220D and 220H during the boot-up mode.

The boot-up operation may include a process of latching the first to eighth fuse signals FZDATA0<0:n> to FZDATA7<0:n> in the first to eighth latch blocks 220A to 220H.

The method for driving the semiconductor device 200 in accordance with an embodiment of the present invention is described below in detail with reference to FIG. 8.

Figure 8:
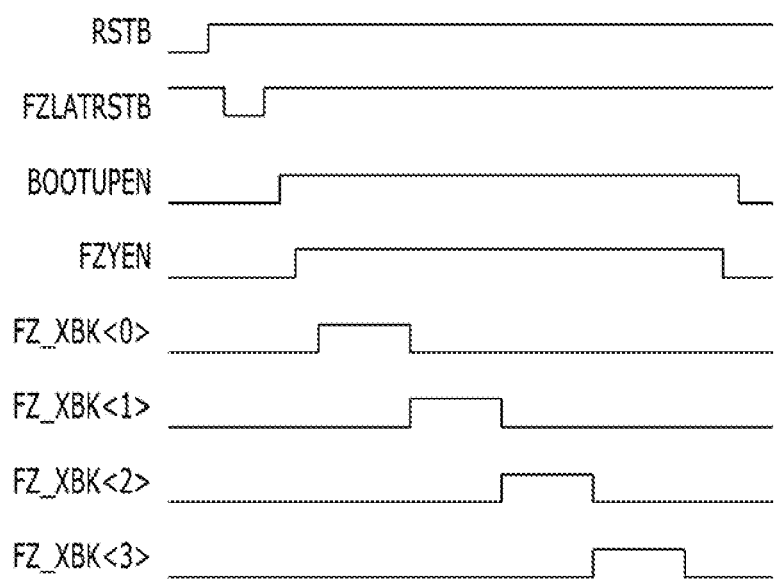
FIG. 8 is a timing diagram illustrating a method for driving a semiconductor device in accordance with an embodiment of the present invention.

FIG. 8 is a timing diagram illustrating the method for driving the semiconductor device in accordance with an embodiment of the present invention.

Referring to FIG. 8, the semiconductor device 200 may enter the initialization mode as an initialization source signal RSTB is enabled to a logic high level. When the semiconductor device 200 enters the initialization mode, a control block (not shown) may generate the initialization signal FZLATRSTB enabled to a logic low level during a predetermined initialization section in response to the initialization source signal RSTB.

Then, the first and fifth latch blocks 220A and 220E may be initialized in response to the initialization signal FZLATRSTB. For example, the first and fifth latch blocks 220A and 220E may initialize first and fifth fuse output signals FZOUT0<0:n> and FZOUT4<0:n> to a logic low level in response to the initialization signal FZLATRSTB.

Under the condition, when a boot-up source signal BOOTUPEN is enabled to a logic high level, the control block may generate the boot-up mode signal FZYEN enabled to a logic high level during a predetermined boot-up section in response to the boot-up source signal BOOTUPEN. Also, the first to fourth bank selection signals FZ_XBK<0:3> may be sequentially enabled during the boot-up section.

When the boot-up mode signal FZYEN and the first bank selection signal FZ_XBK<0> are enabled to a logic high level, the fuse block 230 may output the first fuse signals FZDATA0<0:n> and the fifth fuse signals FZDATA4<0:n> to the first latch block 220A and the fifth latch block 220E, respectively. Then, the first and fifth latch blocks 220A and 220E may perform the boot-up operation. In other words, the first latch block 220A may latch the first fuse signals FZDATA0<0:n>, and the fifth latch block 220E may latch the fifth fuse signals FZDATA4<0:n>.

For example, the first latch block 220A may maintain some of the first fuse output signals FZOUT0<0:n> at a logic low level in response to corresponding ones of the first fuse signals FZDATA0<0:n> having the logic low level. Also, the first latch block 220A may transition the levels of some of the first fuse output signals FZOUT0<0:n> to a logic high level in response to corresponding ones of the first fuse signals FZDATA0<0:n> having the logic high level. The fifth latch block 220E may also perform the same operation as the first latch block 220A.

While the first and fifth latch blocks 220A and 220E perform the boot-up operation, the second and sixth latch blocks 220B and 220F may be initialized. For example, the second and sixth latch blocks 220B and 220F may initialize the second and sixth fuse output signals FZOUT1<0:n> and FZOUT5<0:n> to a logic low level in response to the boot-up mode signal FZYEN and the first bank selection signals FZ_XBK<0>.

When the boot-up mode signal FZYEN and the second bank selection signal FZ_XBK<1> are enabled to a logic high level, the fuse block 230 may output the second fuse signals FZDATA1<0:n> and the sixth fuse signals FZDATA5<0:n> to the second latch block 220B and the sixth latch block 220F, respectively. Then, the second and sixth latch blocks 220B and 220F may perform the boot-up operation. In other words, the second latch block 220B may latch the second fuse signals FZDATA1<0:n>, and the sixth latch block 220F may latch the sixth fuse signals FZDATA5<0:n>.

For example, the second latch block 220B may maintain some of the second fuse output signals FZOUT1<0:n> at a logic low level in response to corresponding ones of the second fuse signals FZDATA1<0:n> having the logic low level. Also, the second latch block 220B may transition the levels of some of the second fuse output signals FZOUT1<0:n> to a logic high level in response to corresponding ones of the second fuse signals FZDATA1<0:n> having the logic high level. The sixth latch block 220F may also perform the same operation as the second latch block 220B.

While the second and sixth latch blocks 220B and 220F perform the boot-up operation, the third and seventh latch blocks 220C and 220G may be initialized. For example, the third and seventh latch blocks 220C and 220G may initialize the third and seventh fuse output signals FZOUT2<0:n> and FZOUT6<0:n> to a logic low level in response to the boot-up mode signal FZYEN and the second bank selection signals FZ_XBK<1>.

When the boot-up mode signal FZYEN and the third bank selection signal FZ_XBK<2> are enabled to a logic high level, the fuse block 230 may output the third fuse signals FZDATA2<0:n> and the seventh fuse signals FZDATA6<0:n> to the third latch block 220C and the seventh latch block 220G, respectively. Then, the third and seventh latch blocks 220C and 220G may perform the boot-up operation. In other words, the third latch block 220C may latch the third fuse signals FZDATA2<0:n>, and the seventh latch block 220G may latch the seventh fuse signals FZDATA6<0:n>.

For example, the third latch block 220C may maintain some of the third fuse output signals FZOUT2<0:n> at a logic low level in response to corresponding ones of the third fuse signals FZDATA2<0:n> having the logic low level. Also, the third latch block 220C may transition the levels of some of the third fuse output signals FZOUT2<0:n> to a logic high level in response to corresponding ones of the third fuse signals FZDATA2<0:n> having the logic high level. The seventh latch block 220G may also perform the same operation as the third latch block 220C.

While the third and seventh latch blocks 220C and 220G perform the boot-up operation, the fourth and eighth latch blocks 220D and 220H may be initialized. For example, the fourth and eighth latch blocks 220D and 220H may initialize the fourth and eighth fuse output signals FZOUT3<0:n> and FZOUT7<0:n> to a logic low level in response to the boot-up mode signal FZYEN and the third bank selection signals FZ_XBK<2>.

When the boot-up mode signal FZYEN and the fourth bank selection signal FZ_XBK<3> are enabled to a logic high level, the fuse block 230 may output the fourth fuse signals FZDATA3<0:n> and the eighth fuse signals FZDATA7<0:n> to the fourth latch block 220D and the eighth latch block 220H, respectively. Then, the fourth and eighth latch blocks 220D and 220H may perform the boot-up operation. In other words, the fourth latch block 220D may latch the fourth fuse signals FZDATA3<0:n>, and the eighth latch block 220H may latch the eighth fuse signals FZDATA7<0:n>.

For example, the fourth latch block 220D may maintain some of the fourth fuse output signals FZOUT3<0:n> at a logic low level in response to corresponding ones of the fourth fuse signals FZDATA3<0:n> having the logic low level. Also, the fourth latch block 220D may transition the levels of some of the fourth fuse output signals FZOUT3<0:n> to a logic high level in response to corresponding ones of the fourth fuse signals FZDATA3<0:n> having the logic high level. The eighth latch block 220H may also perform the same operation as the fourth latch block 220D.

The embodiments of the present invention have an advantage in that latch blocks may be initialized at different timings, and the structures, i.e., circuits, for initializing the latch blocks at different timings may be minimized.

In accordance with the embodiments of the present invention, an over-current may be prevented as the initialization operation of the latch blocks may be performed at different timings. Therefore, the latch blocks may normally perform the initialization operation, and malfunction of other circuits operating during the initialization mode caused by the over current may be also prevented.

Furthermore, in accordance with the embodiments of the present invention, there is an advantageous effect in terms of occupying area since the structures, i.e., circuits, for initializing the latch blocks at different timings may be minimized.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the scope of the present invention as defined by the following claims.

For example, although it is described in the embodiments of the present invention that the initialization operation of the latch blocks is controlled on a basis of banks, the inventive concept is not limited to this, and the initialization operation of the latch blocks may be controlled on a basis of a smaller unit, e.g., a mat, rather than a bank or a greater unit, e.g., a bank group.

What is claimed is:

1. A semiconductor device, comprising:
a first block, which is initialized during an initialization mode; and
a second block, which is subsequently initialized while the first block latches first signals during a boot-up mode, wherein an initialization operation of the second block is performed while a boot-up operation is performed on the first block,
wherein the boot-up operation of the second block is performed in response to a first bank selection signal.

2. The semiconductor device of claim 1, wherein the second block latches second signals after being initialized during the boot-up mode.

3. The semiconductor device of claim 2, further comprising a third block, which is initialized while the second block latches the second signals during the boot-up mode,
wherein the third block latches third signals after being initialized during the boot-up mode.

4. The semiconductor device of claim 3, wherein the first to third signals include fuse signals.

5. The semiconductor device of claim 1, wherein the first latch block and the second block are formed in a core region and the first signals are from a peripheral region.

6. A semiconductor device, comprising:
first and second memory regions;
a first block, which is formed corresponding to the first memory region, and which is initialized in response to an initialization signal during an initialization mode; and
a second block, which is formed corresponding to the second memory region, and which is subsequently initialized in response to a boot-up mode signal and a first region selection signal for selecting the first memory region during a boot-up mode, wherein an initialization operation of the second block is performed while a boot-up operation is performed on the first block,
wherein the first and second memory regions and the first and second latch blocks are formed in a core region and the fuse block are from a peripheral region.

7. The semiconductor device of claim 6, further comprising a fuse block suitable for transmitting first fuse signals to the first block in response to the first region selection signal, and transmitting second fuse signals to the second block in response to a second region selection signal for selecting the second memory region.

8. The semiconductor device of claim 7, wherein the first and second region selection signals are sequentially enabled.

9. The semiconductor device of claim 6, further comprising:
third to $n^{th}$ memory regions; and
third to $n^{th}$ blocks, which are formed respectively corresponding to the third to $n^{th}$ memory regions, and which are initialized in response to the boot-up mode signal and second to $(n-1)^{th}$ region selection signals for selecting the second to $(n-1)^{th}$ memory regions during the boot-up mode.

10. The semiconductor device of claim 9, further comprising a fuse block suitable for sequentially transmitting first to $n^{th}$ fuse signals to the first to $n^{th}$ blocks for each of the first to $n^{th}$ memory regions in response to the first to $(n-1)^{th}$ region selection signals and a $n^{th}$ region selection signal for selecting the $n^{th}$ memory region during the boot-up mode.

11. A method for driving a semiconductor device, comprising:
initializing a first latch block;
subsequently initializing a second latch block while the first latch block performs a boot-up operation; and
performing the boot-up operation of the second latch block,
wherein an initialization operation of the second latch block and the boot-up operation of the first latch block are performed at the same time, and
wherein the boot-up operation of the second latch block is performed in response to a first bank selection signal.

12. The method of claim 11,
wherein the first latch block performs the boot-up operation by latching first fuse signals, and
wherein the performing the boot-up operation of the second latch block latches second fuse signals in the second latch block.

13. The method of claim 11, further comprising sequentially performing the boot-up operation of third to $n^{th}$ latch blocks after the first and second latch blocks perform the boot-up operation,
wherein the third to $n^{th}$ latch blocks are sequentially initialized while the second to $(n-1)^{th}$ latch blocks sequentially perform the boot-up operation.

* * * * *